(12) United States Patent
Eun

(10) Patent No.: US 8,169,048 B2
(45) Date of Patent: May 1, 2012

(54) ISOLATION STRUCTURE IN A MEMORY DEVICE

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/023,992

(22) Filed: Feb. 9, 2011

(65) Prior Publication Data

US 2011/0127634 A1  Jun. 2, 2011

Related U.S. Application Data

(62) Division of application No. 12/164,579, filed on Jun. 30, 2008, now Pat. No. 7,919,390.

(30) Foreign Application Priority Data

Apr. 10, 2008  (KR) ........................ 10-2008-0033168

(51) Int. Cl.
*H01L 21/70* (2006.01)
(52) U.S. Cl. ................................ 257/513; 257/E21.546
(58) Field of Classification Search .................. 257/501, 257/511, 513, E21.546
See application file for complete search history.

(56) References Cited

U.S. PATENT DOCUMENTS

| 4,845,048 | A | 7/1989 | Tamaki et al. |
| 6,482,715 | B2 | 11/2002 | Park et al. |
| 6,756,654 | B2 | 6/2004 | Heo et al. |
| 7,163,869 | B2 | 1/2007 | Kim et al. |
| 7,271,463 | B2 | 9/2007 | Smythe, III et al. |
| 7,271,464 | B2 | 9/2007 | Trivedi et al. |
| 7,575,981 | B2 | 8/2009 | Lee et al. |
| 7,785,985 | B2 | 8/2010 | Shin et al. |
| 2002/0076900 | A1 | 6/2002 | Park et al. |
| 2004/0248374 | A1 | 12/2004 | Belyansky et al. |
| 2006/0024912 | A1 | 2/2006 | Lee |
| 2008/0166854 | A1 | 7/2008 | Shin et al. |
| 2009/0020847 | A1 | 1/2009 | Byun et al. |
| 2009/0068816 | A1 | 3/2009 | Eun |

FOREIGN PATENT DOCUMENTS

| KR | 10-0567070 | 3/2006 |
| KR | 10-2007-0098322 | 10/2007 |
| KR | 10-0881135 | 1/2009 |

*Primary Examiner* — N Drew Richards
*Assistant Examiner* — Grant Withers
(74) *Attorney, Agent, or Firm* — Marshall, Gerstein & Borun LLP

(57) ABSTRACT

An isolation structure in a memory device and a method for fabricating the isolation structure. In the method, a first trench is formed in a cell region of a semiconductor substrate and a second trench in a peripheral region of the semiconductor substrate. A liner layer comprising a silicon nitride layer is formed on the first and second trenches. A spin on dielectric (SOD) layer comprising polysilazane is formed on the liner layer so as to fill the first and second trenches. A portion of the SOD layer filling the second trench is removed. A portion of the silicon nitride layer, which is disposed on the second trench and is exposed after the removing of the portion of the SOD layer, is oxidized using oxygen plasma and heat generated from the plasma. A high density plasma (HDP) oxide layer is formed to fill the second trench.

1 Claim, 7 Drawing Sheets

ISOLATION STRUCTURE IN A MEMORY DEVICE

CROSS-REFERENCE TO RELATED APPLICATIONS

This is a division of U.S. application Ser. No. 12/164,579 filed Jun. 30, 2008, which claims the priority benefit under USC 119 of KR 10-2008-0033168, filed on Apr. 10, 2008, the entire respective disclosures of which are incorporated herein by reference.

BACKGROUND OF THE INVENTION

The invention relates generally to a semiconductor device and, more particularly, to an isolation structure in a memory device and a method for fabricating the isolation structure.

Circuit patterns of highly integrated semiconductor memory devices are formed according to small design rules. For example, circuit patterns of dynamic random access memory (DRAM) devices are finely formed according to design rules of approximately 50 nm or less. Since semiconductor memory devices are fabricated according to small design rules, improved gap filling methods are required to form isolation structures in the semiconductor memory devices. For example, when a shallow trench isolation (STI) method is used for forming isolation structures in a highly integrated semiconductor memory device, the use of a dielectric material having good gap-filling characteristics is important since trenches having narrow widths and large aspect ratios are used in the STI method.

When 50 nm or smaller design rules are used, it is difficult to fill a trench through a high density plasma (HDP) process. To address this difficulty, flowable dielectric materials having better gap-filling characteristics than HDP oxides can be used to fill trenches. In detail, a liquid or suspension of a dielectric material source is useful to fill trenches owing to the good fluidity of such liquids and suspensions. Then, the applied liquid or suspension is cured to form an isolation dielectric layer in the trenches. For example, the liquid or suspension can be applied using a spin coater. In this case, a spin on dielectric (SOD) layer may be formed as the isolation dielectric layer.

However, when flowable dielectrics are used to fill trenches, undesired punchthrough can be observed in a p-channel metal oxide semiconductor (PMOS) transistor. For example, undesired hot electron induced punchthrough (HEIP) can occur in PMOS transistors, which are generally formed in a peripheral region of a DRAM device. It is considered that the punchthrough phenomenon is caused by a nitride liner layer disposed between a flowable dielectric layer and walls of a trench.

FIGS. 1 and 2 illustrate schematic views for explaining HEIP of a PMOS transistor.

Referring to FIGS. 1 and 2, an isolation layer 20 can be formed into an STI structure so as to define an active region 10 in a semiconductor substrate. In this case, operations of a gate 30 of a PMOS transistor formed in the active region 10 are affected by an effective channel width of the active region 10. The effective channel width of the active region 10 is determined by the width of the active region 10 and charge distribution along the interface between the active region 10 and the isolation layer 20.

For example, in a DRAM device having a small design rule, many hot electrons are generated due to strong electric fields between channels. Such hot electrons (indicated by "e" in FIG. 1) permeate the isolation layer 20 and are trapped in the isolation layer 20 in the vicinity of the interface between the active region 10 and the isolation layer 20. The trapped hot electrons (e) attract p-type carriers (i.e., holes (+)) such that the p-type carriers are trapped in a portion of the active region 10 close to the isolation layer 20. The trapped p-type carriers may reduce the effective channel width of the PMOS transistor. In this case, the threshold voltage of the PMOS transistor is greatly reduced. Therefore, off leakage current of the PMOS transistor may increase significantly when the PMOS transistor is turned off.

Referring to FIG. 2, a three-layer liner is disposed between the active region 10 and the isolation layer 20 for improving interface characteristics between the active region 10 and the isolation layer 20. The three-layer liner includes a first silicon oxide layer 21, a silicon nitride layer 23, and a second silicon oxide layer 25. Owing to a potential well of the three-layer liner, hot electrons (e) can be trapped in the silicon nitride layer 23. Significantly, such hot electrons (e) trapped in trap sites of the silicon nitride layer 23 deteriorate HEIP characteristics of the PMOS transistor.

If the isolation layer 20 is formed of a flowable dielectric layer, the HEIP characteristics of the PMOS transistor may be more greatly deteriorated. In detail, while a flowable liquid dielectric material source is applied and cured to form the isolation layer 20, the isolation layer 20 and the silicon nitride layer 23 can be subjected to mechanical stress. For example, when the flowable liquid dielectric material source is cured to form the isolation layer 20, the isolation layer 20 and the silicon nitride layer 23 can be subjected to mechanical stress due to shrinkage of the flowable liquid dielectric material source. Such stresses increase electron trap sites of the silicon nitride layer 23, and thus more electrons can be trapped in the silicon nitride layer 23. This results in the same effect as the case where electrons are trapped in a portion of the isolation layer 20 close to the active region 10 as shown in FIG. 1. Therefore, the HEIP characteristics of the PMOS transistor deteriorate more significantly.

SUMMARY OF THE INVENTION

Embodiments of the invention are directed to an isolation structure formed in a memory device using a flowable dielectric layer by a shallow trench isolation (STI) method to prevent deterioration of characteristics of hot electron induced punchthrough (HEIP) in a PMOS transistor, and a method for fabricating the isolation structure.

In one embodiment, the invention provides a method for fabricating an isolation structure in a memory device, the method comprising: forming a first trench in a cell region of a semiconductor substrate and forming a second trench in a peripheral region of the semiconductor substrate; forming a liner layer comprising a silicon nitride layer on the first and second trenches; forming a first isolation layer comprising a flowable dielectric layer on the liner layer to fill the first and second trenches; removing a portion of the first isolation layer filling the second trench to expose the silicon nitride layer disposed on the second trench; oxidizing a portion of the exposed silicon nitride layer disposed on the second trench; and, forming a second isolation layer to fill the second trench.

In another embodiment, the invention provides a method for fabricating an isolation structure in a memory device, the method comprising: forming a first trench in a cell region of a semiconductor substrate and a second trench in a peripheral region of the semiconductor substrate; forming a liner layer comprising a silicon nitride layer on the first and second trenches; forming a polysilazane spin on dielectric (SOD) layer on the liner layer to fill the first and second trenches;

removing a portion of the SOD layer filling the second trench to expose the silicon nitride layer disposed on the second trench; oxidizing a portion of the exposed silicon nitride layer disposed on the second trench after removing the portion of the SOD layer, by using oxygen plasma and heat generated from the plasma; and, forming a high density plasma (HDP) oxide layer to fill the second trench.

The first trench preferably defines a first active region of the semiconductor substrate in which a channel of an n-channel metal oxide semiconductor (NMOS) transistor is to be formed, and the second trench is preferably wider than the first trench. The second trench preferably defines a second active region of the semiconductor substrate in which a channel of a p-channel metal oxide semiconductor (PMOS) transistor is to be formed.

Forming of the liner layer preferably comprises: forming a wall oxide layer by oxidizing surfaces of the first and second trenches; depositing the silicon nitride layer on the wall oxide layer; and depositing a silicon oxide layer on the silicon nitride layer, wherein a portion of the silicon oxide layer disposed at the second trench is removed when the portion of the first isolation layer filling the second trench is removed.

Forming the SOD layer preferably comprises: applying a polysilazane solution to form a polysilazane layer filling the first and second trenches; curing the polysilazane layer in an atmosphere including hydrogen ($H_2$) and oxygen ($O_2$); and planarizing the cured polysilazane layer, preferably by chemical mechanical polishing (CMP), so as to separate the polysilazane layer into portions disposed in the first and second trenches.

Removing the portion of the SOD layer preferably comprises: forming a mask to cover the portion of the SOD layer filling the first trench; wet-etching the other portion of the SOD layer not covered with the mask; and terminating the wet-etching after the silicon nitride layer of the liner layer is exposed.

Oxidizing the portion of the silicon nitride layer is preferably performed in situ prior to forming the HDP oxide layer, and oxidizing the portion of the silicon nitride layer preferably comprises: supplying an oxidation gas comprising oxygen to the portion of the silicon nitride layer; and exciting the oxidation gas to a plasma state to oxidize the portion of the silicon nitride layer by oxygen plasma.

In still another embodiment, the invention provides an isolation structure in a memory device, the isolation structure comprising: a semiconductor substrate comprising a first trench in a cell region and a second trench in a peripheral region, the first trench defining a first active region of the semiconductor substrate in which a channel of an n-channel metal oxide semiconductor (NMOS) transistor is to be formed, the second trench being wider than the first trench and defining a second active region of the semiconductor substrate in which a channel of a p-channel metal oxide semiconductor (PMOS) transistor is to be formed; a first liner layer disposed on the first trench and comprising a silicon nitride layer; a flowable dielectric layer disposed on the first liner layer to fill the first trench; a second liner layer disposed on the second trench and comprising an oxide layer; and, a high density plasma (HDP) oxide layer disposed on the second liner layer to fill the second trench.

The first liner layer preferably further comprises: a wall oxide layer formed by oxidizing a surface of the first trench and disposed between the first trench and the silicon nitride layer; and a silicon oxide layer disposed on the silicon nitride layer. The oxide layer of the second liner layer preferably comprises: a wall oxide layer formed by oxidizing a surface of the second trench; and an oxide layer formed by oxidizing a silicon nitride layer using oxygen plasma.

DESCRIPTION OF SPECIFIC EMBODIMENTS

Figure 1:
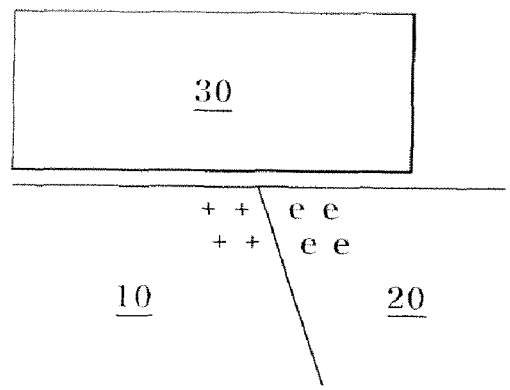
FIGS. 1 and 2 illustrate schematic views for explaining hot electron induced punchthrough (HEIP) of a p-channel metal oxide semiconductor (PMOS) transistor.
Figure 2:
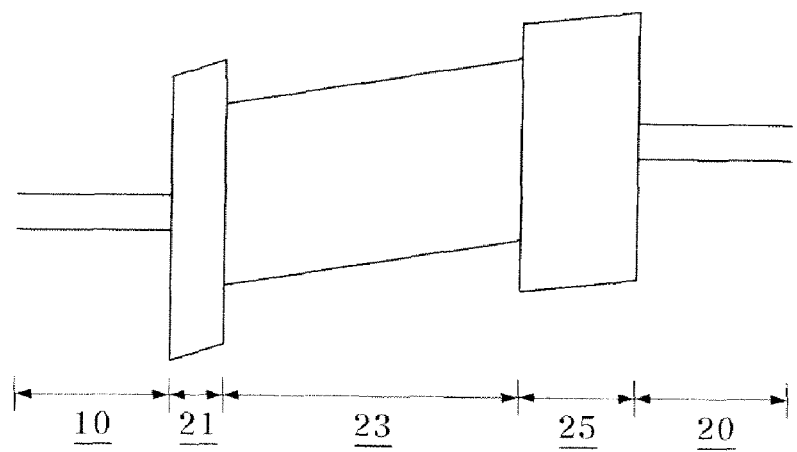

An isolation structure in a memory device and a method for fabricating the isolation structure in accordance with the invention are described in detail below with reference to the accompanying drawings.

In an embodiment of the invention, different isolation structures are formed in a cell region and a peripheral region. In the cell region, memory cells including n-channel metal oxide semiconductor (NMOS) transistors are arranged, and in the peripheral region, p-channel metal oxide semiconductor (PMOS) transistors and NMOS transistors are arranged. In the cell region, the isolation structure includes a liner layer having a silicon nitride layer disposed between a first trench and a first isolation layer. In the peripheral region, the isolation structure does not include a silicon nitride layer disposed between a second trench and a second isolation layer. For this, in the isolation structure of the peripheral region, a liner layer having a silicon nitride layer is converted into a liner layer having a silicon oxide layer. Therefore, generation of electron trap sites can be restricted between the second trench and the second isolation layer, and thus deterioration of characteristics of hot electron induced punchthrough (HEIP) of a PMOS transistor can be prevented.

In a PMOS transistor, a liner layer including a silicon nitride layer may cause deterioration of HEIP characteristics. However, in a cell region, the liner layer including the silicon nitride layer may improve the refresh characteristics of NMOS transistors of dynamic random access memory (DRAM) cells. For example, the silicon nitride layer may prevent permeation of an oxidation source into an interface of an isolation layer when a gate oxide layer is formed after forming a swallow trench isolation (STI) layer, or when a screen oxide layer is formed for ion implantation. If the oxidation source permeates in to the interface of the isolation layer, the interface of the isolation layer can be excessively oxidized, or a sidewall of the isolation layer can be lifted. In addition, an interface between the isolation layer and an active region can be excessively stressed.

Such deterioration in interfacial characteristics may increase a leakage current of a cell transistor. Therefore, the silicon nitride layer can reduce a leakage current of a cell transistor by preventing permeation of the oxidation source into the interface of the isolation layer. In an embodiment of the invention, a liner structure comprising a silicon nitride layer is formed in a cell region between a first isolation layer and a first trench so as to reduce a leakage current of a cell transistor. Therefore, refresh characteristics of a DRAM cell can be improved. That is, a DRAM cell can be less frequently refreshed.

On the other hand, a liner structure comprising a silicon oxide layer is formed in a peripheral region between a second isolation layer and a second trench so as to reduce electron trap sites. That is, a silicon nitride layer providing many electron trap sites is not used in the peripheral region. Therefore, fewer hot electrons may be trapped between the second trench and the second isolation layer so that a decrease of an effective width of a channel of a PMOS transistor (i.e., deterioration of HEIP characteristics) can be prevented.

As the design rule of DRAM devices reduces to approximately 50 nm or less, very narrow trenches (first trenches) are formed in a cell region to isolate devices. A first isolation layer is formed of a flowable dielectric material such as a spin on dielectric (SOD) having good gap filling characteristics to fill the narrow first trenches. On the other hand, in a peripheral region of the DRAM device, a second isolation layer can be formed using a high density plasma (HDP) oxide layer to fill second trenches since the second trenches are relative wider than the first trenches. In detail, prior to forming the first isolation layer, a liner structure including a silicon nitride layer is formed on the first and second trenches of the cell and peripheral regions, and an SOD is applied to the first and second trenches and is cured.

A polysilazane-containing material is preferably used as the SOD. Unlike spin on glass (SOG) such as conventional hydrosilsesquioxane, the polysilazane based SOD can be cured at a relatively low temperature, and fewer pores or voids are generated during the curing of the polysilazane based SOD. Since the SOG shrinks largely generates pores when it is cured, it is difficult to form an isolation structure having a fine line width using the SOG. That is, it is difficult to form an isolation structure in a 50 nm or smaller semiconductor devices using the SOG. In an embodiment of the invention, first trenches of a cell region are filled with an SOD, and second trenches of a peripheral region are filled with an HDP oxide. For this, after removing a portion of the SOD filled in the second trenches, an exposed silicon nitride layer is sufficiently oxidized. The oxidation of the silicon nitride layer may be performed in situ prior to forming of an HDP oxide layer. Therefore, an additional apparatus may be not necessary for removing the silicon nitride layer.

FIGS. 3 to 13 illustrate schematic views for explaining an isolation structure in a memory device and a method for fabricating the isolation structure according embodiments of the invention.

Figure 3:
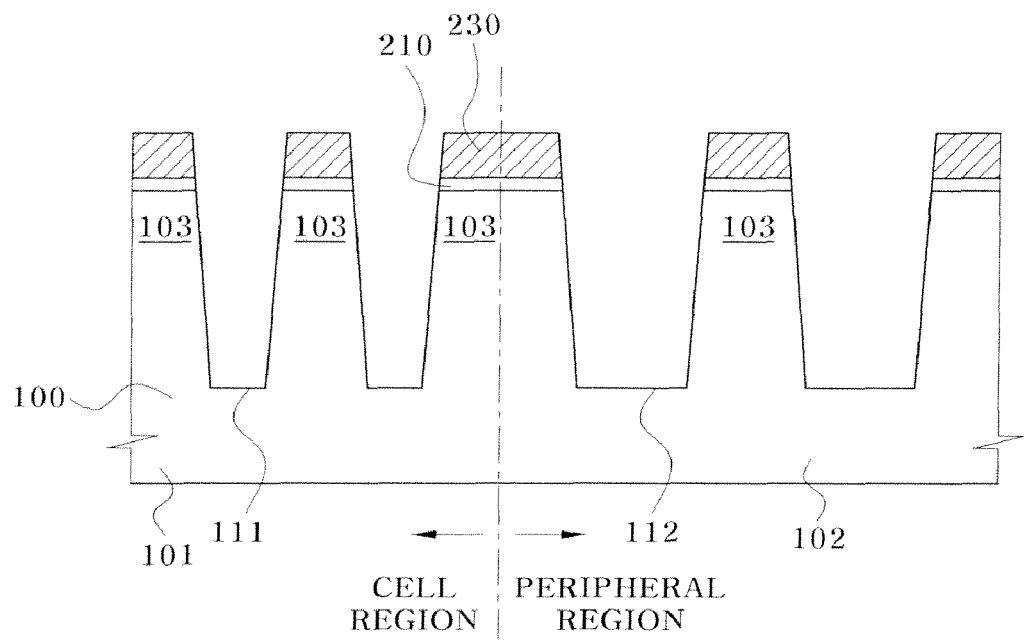
FIGS. 3 to 13 illustrate schematic views for explaining an isolation structure in a memory device and a method for fabricating the isolation structure according embodiments of the invention.

Referring to FIG. 3, a semiconductor substrate 100 includes a cell region 101, a peripheral region 102, and first and second trenches 111 and 112, respectively. NMOS transistors will be formed in the cell region 101 as cell transistors, and PMOS transistors will be disposed in the peripheral region 102. The first and second trenches 111 and 112 are preferably formed in the semiconductor substrate 100 through a shallow trench isolation (STI) process. The semiconductor substrate 100 is preferably a silicon (Si) single crystal substrate. The first and second trenches 111 and 112 are preferably formed as follows. First, an oxide pad layer 210 and a nitride pad layer 230 are sequentially formed on the semiconductor substrate 100. Then, portions of the semiconductor substrate 100 exposed through openings of the nitride pad layer 230 are etched to form the first and second trenches 111 and 112 that define active regions 103.

The first and second trenches 111 and 112 are preferably formed to a depth of approximately 1600 Å to approximately 1800 Å. The first trenches 111 formed in the cell region 101 are preferably narrower than the second trenches 112 formed in the peripheral region 102. Since semiconductor memory devices, such as dynamic random access memory (DRAM) devices, are fabricated according to design rules of approximately 50 nm or less, line widths of the active regions 103 of the cell region 101 are very narrow. Therefore, the first trenches 111 defining the active regions 103 are very narrow. A flowable dielectric material such as a polysilazane based spin on dielectric (SOD) is used to form a dielectric layer filling the narrow first trenches 111 without nano-metric voids. Before filling the first and second trenches 111 and 112 with an isolation layer, a liner layer is deposited on the first and second trenches 111 and 112 for improving interface characteristics between the isolation layer and the first and second trenches 111 and 112.

Figure 4:
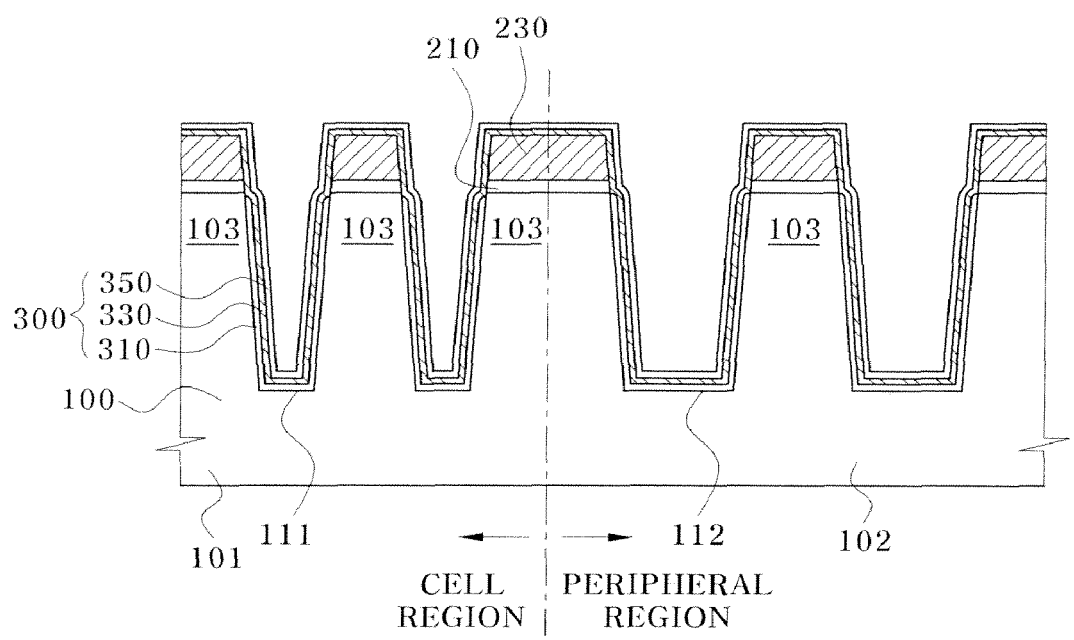

In detail, referring to FIG. 4, a first liner layer 300 is formed on side and bottom walls of the first and second trenches 111 and 112. The first liner layer 300 preferably has a multi-layer structure including different dielectric layers. For example, the first liner layer 300 preferably comprises a first oxide layer 310, a silicon nitride layer 330, and a second oxide layer 350. The first oxide layer 310 is preferably formed as a wall oxide layer covering exposed surfaces of the first and second trenches 111 and 112 by oxidizing a top surface of the semiconductor substrate 100. The first oxide layer 310 is preferably formed by thermal oxidation to compensate for surface defects created when the first and second trenches 111 and 112 are formed. Furthermore, the first oxide layer 310 reduces stresses between the first and second trenches 111 and 112 and the silicon nitride layer 330.

The silicon nitride layer 330 is deposited on the first oxide layer 310 as a liner. The silicon nitride layer 330 is preferably deposited to a thickness of approximately 70 Å to approximately 75 Å. The silicon nitride layer 330 may prevent permeation of an oxidant source during subsequent processes after the first and second trenches 111 and 112 are formed through the STI process. For example, the silicon nitride layer 330 may prevent permeation of an injected oxidant source during oxidation or thermal oxidation processes for forming a screen oxidation layer for adjusting a threshold voltage of transistors or a gate dielectric layer. If the oxidant source permeates into the active regions 103, a thick oxidation layer can be formed between the isolation layer and the active regions 103. In this case, a large amount of current can flow when transistors operate. That is, the silicon nitride layer 330 prevents deterioration of isolation characteristics during subsequent processes, and thus junction leakage can be prevented. Therefore, NMOS transistors of DRAM cells can be less frequently refreshed.

The second oxide layer 350 is deposited as a liner on the silicon nitride layer 330. The second oxide layer 350 reduces stresses between the silicon nitride layer 330 and the isolation layer that substantially fills the first and second trenches 111 and 112.

Figure 5:
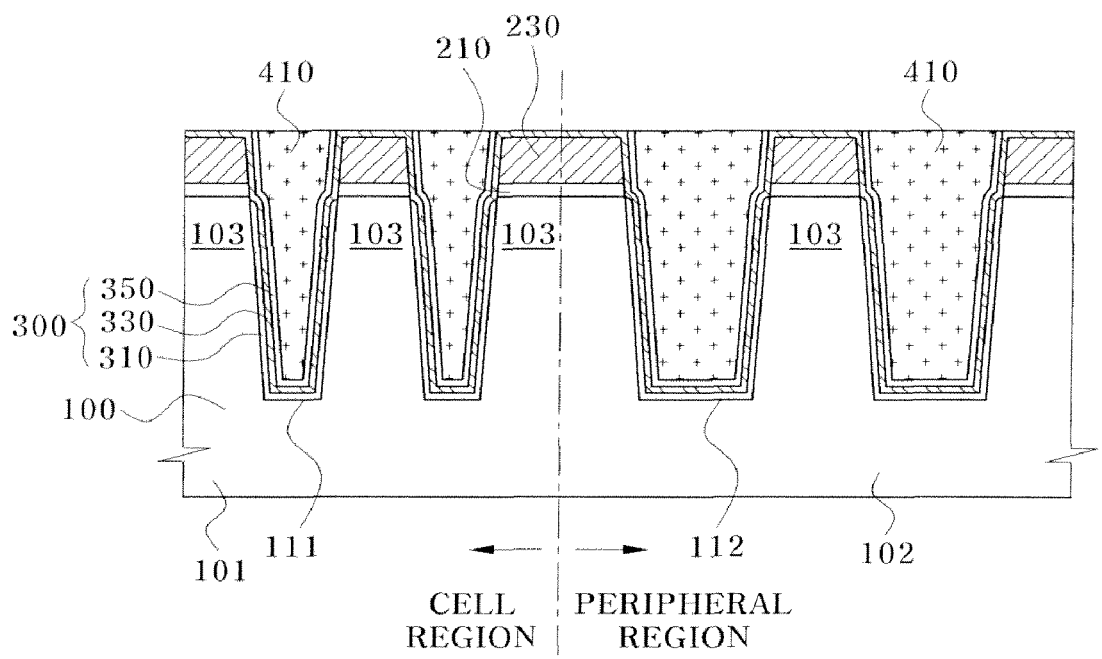

Referring to FIG. 5, a first isolation layer 410 is formed to fill the first and second trenches 111 and 112. The first isolation layer 410 is formed of a flowable dielectric layer such as an SOD layer so as to completely fill the narrow first trenches 111. The first trenches 111 define the active regions 103 in the cell region 101 of a DRAM device, and the first isolation layer 410 disposed in the first trenches 111 isolates NMOS transistors of cells of the DRAM device.

The first isolation layer 410 is preferably formed of a polysilazane based SOD so as to completely fill the first trenches 111 having a narrow line width suitable for a 50-nm or less semiconductor memory device. For example, the first isolation layer 410 may be formed as follows. After mounting the semiconductor substrate 100 on a spin chuck of a spin coater, a polysilazane solution is applied to the semiconductor substrate 100 while rotating the spin chuck. Since the polysilazane solution is flowable, the first trenches 111 can be completely filled with the polysilazane solution while the polysilazane solution is applied to the rotating semiconductor substrate 100. At this time, the relatively wide second trenches 112 are also filled with the polysilazane solution.

Then, a solvent of the polysilazane solution is volatilized, and the remaining polysilazane is cured to form the first isolation layer 410 as a silicon oxide ($SiO_2$) dielectric layer. Here, the remaining polysilazane may be cured by annealing the remaining polysilazane in a reaction gas atmosphere including hydrogen ($H_2$) and oxygen ($O_2$). A mixture having a hydrogen:oxygen ratio of approximately 1:2 may be supplied at a predetermined flow rate during the annealing of the remaining polysilazane. The annealing of the remaining polysilazane may be performed at a relatively low temperature of approximately 350° C. for about an hour. During the curing (annealing), the polysilazane reacts with hydrogen and oxygen and changes to a silicon oxide layer.

Such a polysilazane based SOD layer is a flowable dielectric layer, which does not have problems of hydrosilsesquioxane (HSQ) based SOC (spin on glass) layer. HSQ shrinks significantly when it is cured, and thus, active regions are stressed by the shrinkage of the HSQ. As a result, the possibility of undesired deformation increases. Furthermore, due to voids within an HSQ dielectric layer, the HSQ dielectric layer is not suitable for being used for an isolation structure of a semiconductor device having a design rule of approximately 50 nm or less. The polysilazane based SOD layer does not have void and shrinkage related problems so that a stable isolation structure can be provided.

After forming the first isolation layer 410 using the polysilazane based SOD layer to fill the first and second trenches 111 and 112, the first isolation layer 410 is planarized. The planarization of the first isolation layer 410 is preferably performed by chemical mechanical polishing (CMP) until the silicon nitride layer 330 of the first liner layer 300 is exposed.

Figure 6:
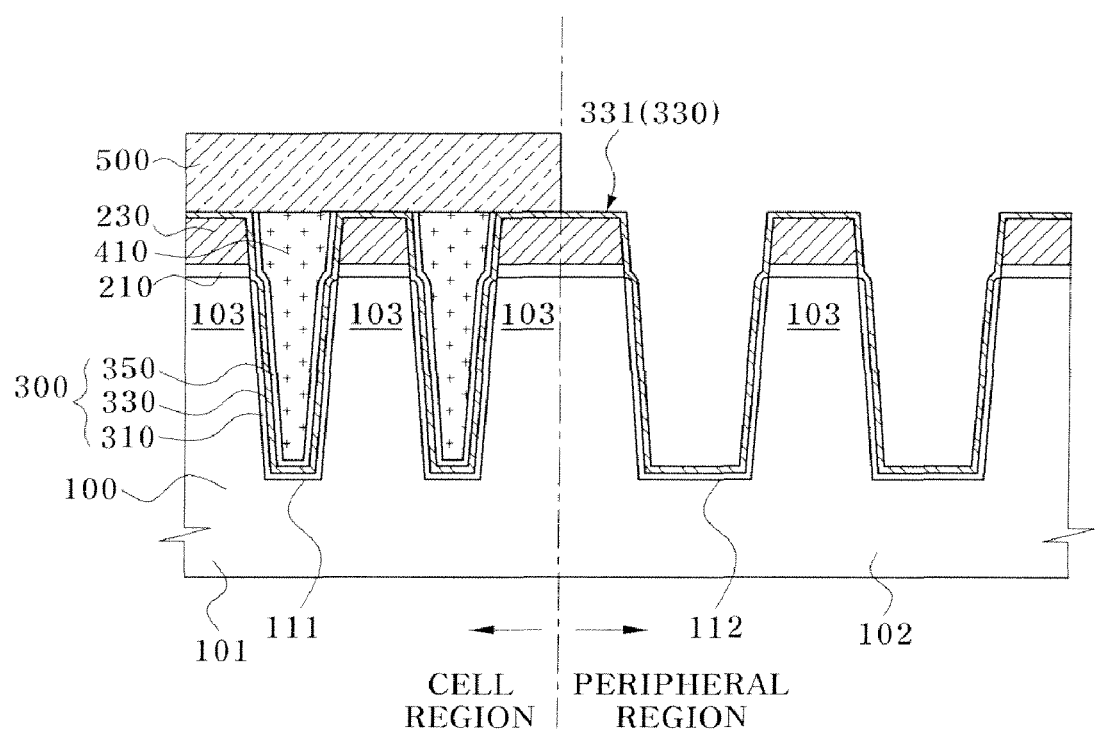

Referring to FIG. 6, the first isolation layer 410 is selectively removed to expose portions 331 of the silicon nitride layer 330 of the first liner layer 300 that are located in the second trenches 112. For this, a mask 500 is disposed to cover portions of the first isolation layer 410 filled in the first trenches 111 of the cell region 101. The peripheral region 102 is not covered with the mask 500. The mask 500 may be a photoresist pattern formed by photolithography including exposing and developing. Thereafter, the semiconductor substrate 100 on which the mask 500 is disposed is placed into an oxide etchant so as to remove exposed portions of the first isolation layer 410. The oxide etchant is preferably a hydrofluoride (HF) solution having a HF:solvent ratio of 1:100. The exposed portions of the first isolation layer 410 disposed in the peripheral region 102 are removed through the selective wet etch process. During the selective wet etch process, portions of the second oxide layer 350 of the first liner layer 300 are removed from the peripheral region 102, and thus the portions 331 of the silicon nitride layer 330 are exposed.

The portions 331 of the silicon nitride layer 330 disposed in the second trenches 112 are exposed to the oxide etchant for a relatively long time while the portions of the first isolation layer 410 and the second oxide layer 350 are removed through the selective wet etch process. For example, the semiconductor substrate 100 may be placed in the HF solution for approximately 380 seconds to approximately 440 seconds so as to completely remove the portions of the first isolation layer 410 and the second oxide layer 350 from the portions 331 of the silicon nitride layer 330. Therefore, the portions 331 of the silicon nitride layer 330 can be seriously attacked by the oxide etchant (HF solution). Therefore, undesired pinholes can be formed in the portions 331 of the silicon nitride layer 330 by erosion.

In the currently disclosed embodiment, the portions 331 of the silicon nitride layer 330 are removed in a subsequent process. Therefore, the wet etch process can be performed for a long time although pinholes can be formed in the portions 331 of the silicon nitride layer 330. After the wet etch process, pinholes can be formed in the portions 331 of the silicon nitride layer 330 by erosion, and the molecular bonding structure of the portions 331 of the silicon nitride layer 330 can be loosened. Furthermore, the thickness of the portions 331 of the silicon nitride layer 330 can be reduced to half the initial thickness. For example, the thickness of the portions 331 of the silicon nitride layer 330 is preferably reduced to approximately 40 Å.

Thereafter, the mask 500 is removed, preferably by ashing and stripping.

Figure 7:
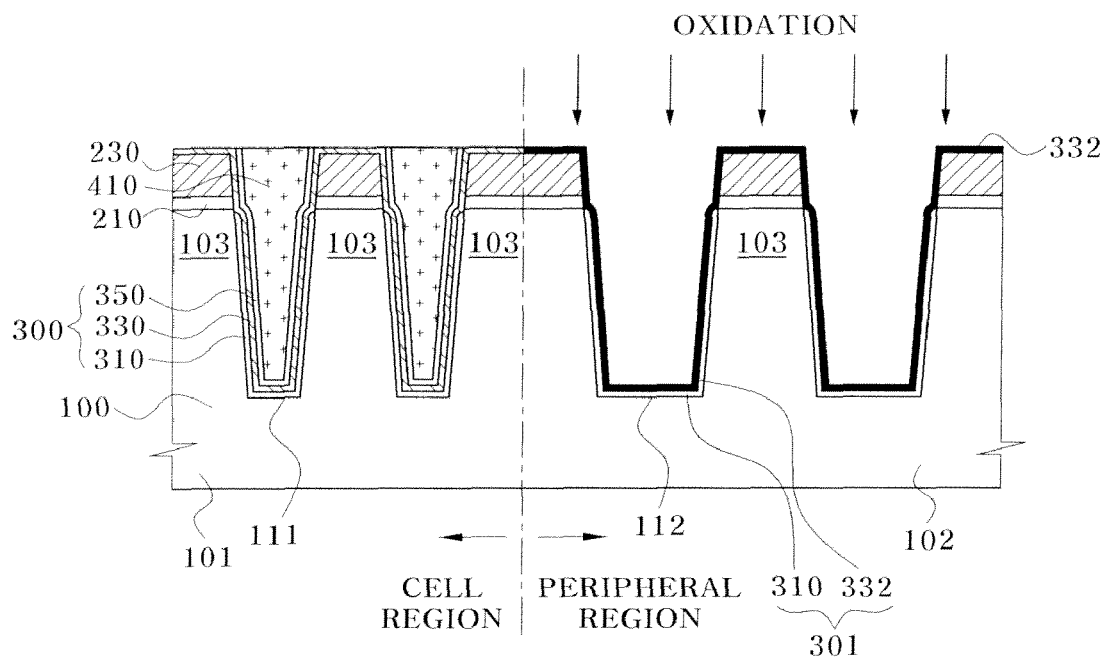

Referring to FIG. 7, the exposed portions 331 of the silicon nitride layer 330 disposed in the second trenches 112 are treated through an oxidation process. For example, the exposed portions 331 of the silicon nitride layer 330 are preferably oxidized using oxygen gas plasma. Then, the portions 331 of the silicon nitride layer 330 are converted to a silicon oxide layer (hereinafter, referred to as a third oxide layer 332). During the oxidation process, the portions 331 of the silicon nitride layer 330 may be completely oxidized to a silicon oxide layer or partially oxidized to a silicon oxide layer containing nitrogen.

In addition to oxygen gas, helium (He) gas is preferably supplied as a carrier gas. The oxygen gas is preferably supplied at a rate of approximately 800 sccm, and the helium gas is preferably supplied at a rate of approximately 100 sccm. The oxygen gas plasma is preferably applied to the portions 331 of the silicon nitride layer 330 using the supplied oxygen and helium gases, and thus the portions 331 of the silicon nitride layer 330 can be completely oxidized to the third oxide layer 332 by the oxygen gas plasma and plasma heating.

The oxidation process for converting the portions 331 of the silicon nitride layer 330 into the third oxide layer 332 may be in situ with a subsequent process for depositing a second isolation layer in the second trenches 112. In the currently illustrated embodiment, the second isolation layer is preferably disposed using HDP. Therefore, the portions 331 of the silicon nitride layer 330 can be oxidized in an HDP chamber.

Figure 14:
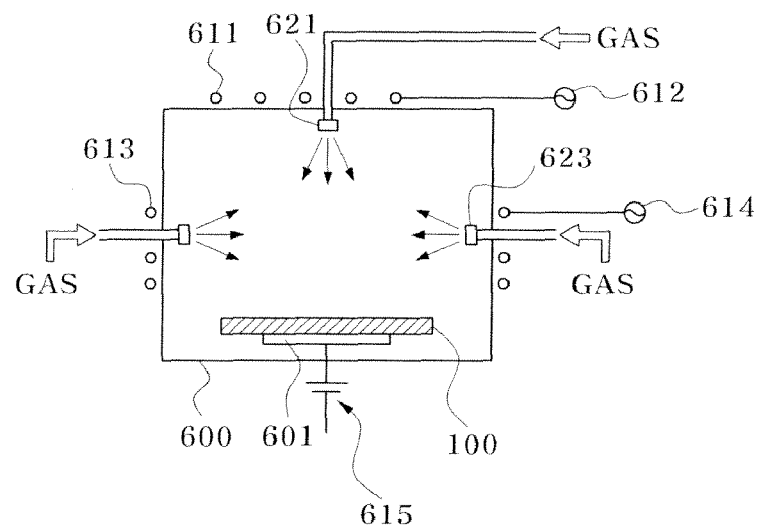
FIG. 14 illustrates a schematic view of a high density plasma (HDP) chamber according to an embodiment of the invention.

An example of the HDP chamber is illustrated in FIG. 14. The exemplary HDP chamber includes a process chamber 600 and a chuck 601 disposed in the process chamber 600. In the process chamber 600, the semiconductor substrate 100 is mounted on the chuck 601, and HDP is applied to the semiconductor substrate 100. The process chamber 600 may have a cylindrical shape. A top plasma coil 611 may be disposed on a top wall of the process chamber 600, and a side plasma coil 613 may be disposed around a sidewall of the process chamber 600. A first power supply 612 is connected to the top plasma coil 611 to supply radio frequency (RF) top power to the top plasma coil 611 for generating plasma, and a second power supply 614 is connected to the side plasma coil 613 to supply RF side power to the side plasma coil 613 for generating plasma. Furthermore, a third power supply 615 is connected to the chuck 601 to apply a direct current (DC) bias bottom voltage to the chuck 601 to a back side of the semiconductor substrate 100 for straightening plasma. An upper gas distributor 621 is disposed in an upper region of the process chamber 600 to inject reaction gas into the process chamber 600, and side gas distributors 623 are disposed in side regions of the process chamber 600 to inject reaction gas into the process chamber 600.

Referring to FIGS. 14 and 7, the semiconductor substrate 100 is mounted in the process chamber 600, and oxygen gas is supplied to the process chamber 600, illustratively at a rate of approximately 800 sccm. At the same time, helium gas is supplied to the process chamber 600, illustratively at a rate of approximately 100 sccm as a carrier gas. Thereafter, RF top power of approximately 7000 W, for example, is applied to the top plasma coil 611 from the first power supply 612, and RF side power of approximately 7000 W, for example, is also applied to the side plasma coil 613 from the second power supply 614 so as to excite reaction gas supplied to the process chamber 600 to a plasma state. Here, the RF top and bottom power can be varied by approximately 500 W, for example. The oxygen gas plasma oxidizes the portions 331 of the silicon nitride layer 330 having loosened molecular bonding structure due to the previous wet etch process. Here, heat generated by plasma excitation facilitates the oxidation of the portions 331 of the silicon nitride layer 330. The oxidation process is illustratively performed for approximately 100 seconds so as to completely oxidize the portions 331 of the silicon nitride layer 330.

Since portions of the silicon nitride layer 330 located in the cell region 101 are not exposed to the oxide etchant during the wet etch process, their dense molecular structure are maintained. Therefore, the portions of the silicon nitride layer 330 located in the cell region 101 may not be completely oxidized. However, since the portions 331 of the silicon nitride layer 330 located in the peripheral region 102 are loosened in molecular structure during the wet etch process, the portions 331 of the silicon nitride layer 330 may be completely oxidized. The portions 331 of the silicon nitride layer 330 are converted to the third oxide layer 332 through the oxidation process. Therefore, the oxidation process gives the same effect as the portions 331 of the silicon nitride layer 330 are removed.

In this way, the portions 331 of the silicon nitride layer 330 disposed in the second trenches 112 of the peripheral region 102 are replaced with the third oxide layer 332. As a result, a second liner layer 301 including the first oxide layer 310 and the third oxide layer 332 is formed in the second trenches 112. On the other hand, the first liner layer 300 including the first oxide layer 310, the silicon nitride layer 330, and the second oxide layer 350 remains in the first trenches 111. In the currently illustrated embodiment, since the second liner layer 301 does not include the silicon nitride layer 330 capable of trapping electrons, the effective channel width of PMOS transistors to be formed in the peripheral region 102 may be not reduced by the silicon nitride layer 330.

Therefore, electron trapping can be effectively prevented in interface regions adjacent to channels of the PMOS transistors. Although the portions 331 of the silicon nitride layer 330 are not completely oxidized, electron trapping can be reduced if the portions 331 of the silicon nitride layer 330 adjacent to inlets of the second trenches 112 are oxidized. In other words, although the portions 331 of the silicon nitride layer 330 adjacent to the bottoms of the second trenches 112 are not sufficiently oxidized, desired effects can be obtained if the portions 331 of the silicon nitride layer 330 adjacent to the inlets of the second trenches 112 are oxidized.

Figure 8:
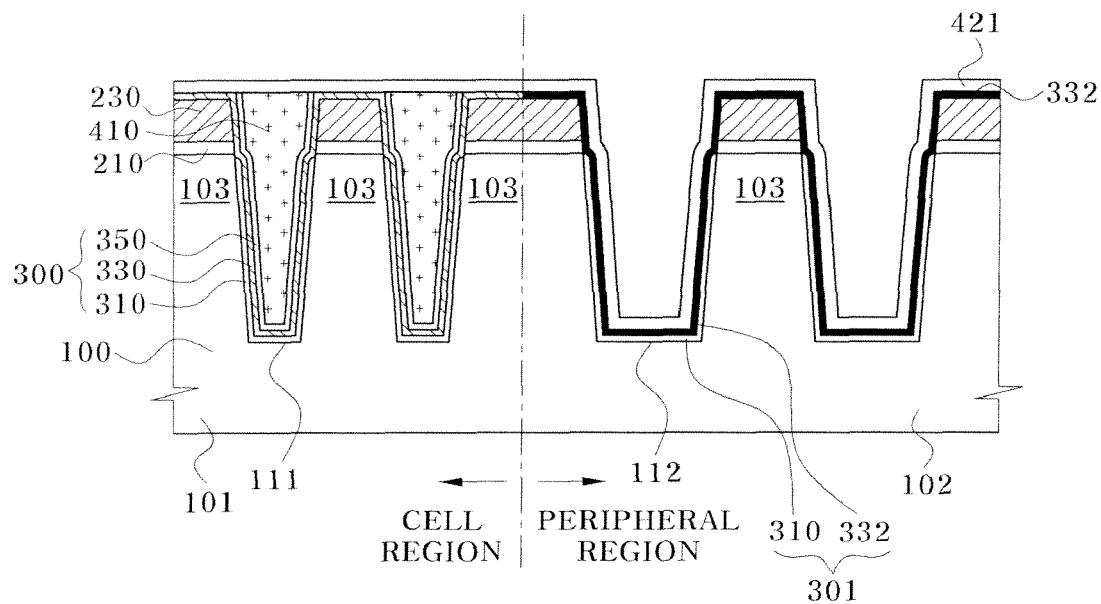

Referring to FIGS. 8 and 14, a buffer layer 421 comprising a silicon oxide is deposited on the second liner layer 301. The deposition of the buffer layer 421 and the previous oxidation process are preferably performed in situ in the process chamber 600. When the second isolation layer is deposited through a subsequent HDP process to fill the second trenches 112, the buffer layer 421 may prevent generation of pores or voids in the second isolation layer. Since the third oxide layer 332 of the second liner layer 301 is formed through the wet etch process and the oxidation process, the third oxide layer 332 may have a rough surface. That is, since the third oxide layer 332 is formed by oxidizing the portions 331 of the silicon nitride layer 330 in which defects such as pinholes are formed, the third oxide layer 332 may have a rough surface. In this case, when the second isolation layer is deposited, voids can be generated in the second isolation layer. Thus, in the current embodiment, the buffer layer 421 is formed to smooth the rough surface of the third oxide layer 332.

The buffer layer 421 may be formed on sidewalls of the second trenches 112 to a thickness suitable for preventing generation of void. For example, the buffer layer 421 preferably has a thickness in the range from approximately 250 Å to approximately 350 Å. For example, the buffer layer 421 preferably has a thickness of approximately 300 Å. A deposition source preferably comprising oxygen ($O_2$) gas, silane ($SiH_4$) gas, and helium (He) gas is supplied to the process chamber 600 in situ with the oxidation process.

The oxygen ($O_2$) gas is preferably supplied to the process chamber 600 through the side gas distributors 623 at a flow rate of approximately 100 sccm to approximately 115 sccm. For example, the oxygen ($O_2$) gas may be supplied to the process chamber 600 through the side gas distributors 623 at a flow rate of approximately 108 sccm. The silane ($SiH_4$) gas may be supplied to the process chamber 600 through the side gas distributors 623 at a flow rate of approximately 40 sccm to approximately 55 sccm. For example, the silane ($SiH_4$) gas may be supplied to the process chamber 600 through the side gas distributors 623 at a flow rate of approximately 47 sccm. In addition, the silane ($SiH_4$) gas may be supplied to the process chamber 600 through the upper gas distributor 621 at a flow rate of approximately 25 sccm to approximately 35 sccm. For example, the silane ($SiH_4$) gas may be supplied to the process chamber 600 through the upper gas distributor 621 at a flow rate of approximately 30 sccm. The helium (He) gas is a carrier gas. The helium (He) gas may be supplied to the process chamber 600 through the side gas distributors 623 at a flow rate of approximately 150 sccm to approximately 250 sccm. For example, the helium (He) gas may be supplied to the process chamber 600 through the side gas distributors 623 at a flow rate of approximately 200 sccm. In addition, the helium (He) gas may be supplied to the process chamber 600 through the upper gas distributor 621 at a flow rate of approximately 50 sccm to approximately 150 sccm. For example, the helium (He) gas may be supplied to the process chamber 600 through the upper gas distributor 621 at a flow rate of approximately 100 sccm.

After the deposition source including oxygen ($O_2$), silane ($SiH_4$), and helium (He) gases is supplied, top power may be applied to the top plasma coil 611 from the first power supply 612 in the range from approximately 7500 W to approximately 8500 W. For example, approximately 8000 W top power may be applied to the top plasma coil 611 from the first power supply 612. In addition, side power may be applied to the side plasma coil 613 from the second power supply 614 in the range from approximately 4500 W to approximately 5500 W. For example, approximately 5000 W side power may be applied to the side plasma coil 613 from the second power supply 614. The deposition source is excited to a plasma state by the applied top and side power. In addition, bottom power is applied to the semiconductor substrate 100 from the third power supply 615 in the range from approximately 450 W to approximately 550 W so as to straighten the plasma source (the excited deposition source). For example, approximately 500 W bottom power may be applied to the semiconductor substrate 100 from the third power supply 615. Owing to the plasma source, a silicon oxide layer can be deposited on the third oxide layer 332 as the buffer layer 421.

Figure 9:
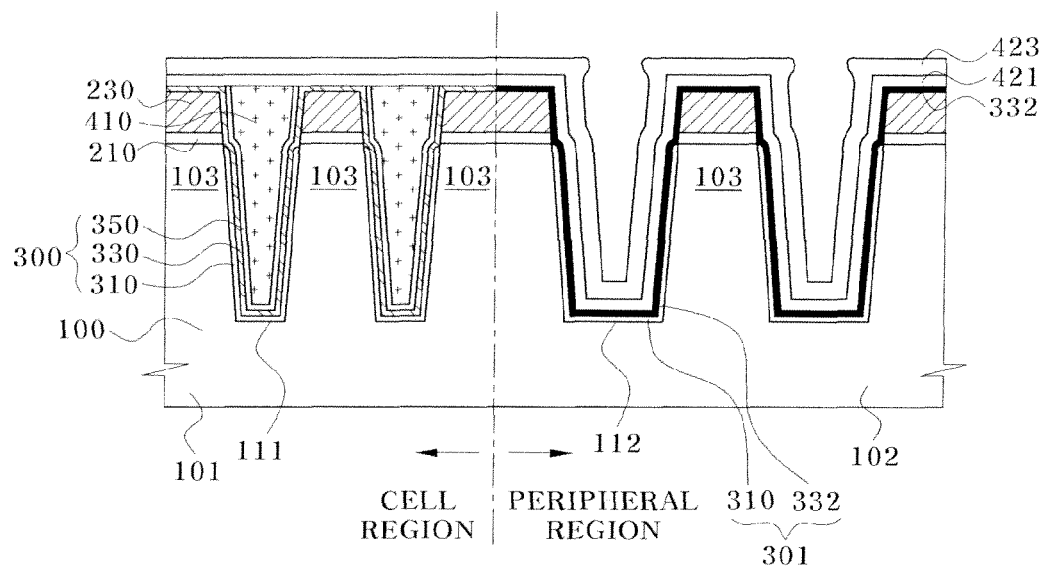

Referring to FIGS. 9 and 14, a first deposition layer 423 is deposited on the buffer layer 421, preferably to a thickness of approximately 300 Å for forming an HDP oxide deposition layer. For this, a deposition source illustratively comprising oxygen ($O_2$), silane ($SiH_4$), and helium (He) gases is supplied to the process chamber 600. The oxygen ($O_2$) gas is illustratively supplied to the process chamber 600 through the side gas distributors 623 at a flow rate lower than the flow rate at which oxygen ($O_2$) gas is supplied to the process chamber 600 for forming the buffer layer 421. For example, the oxygen ($O_2$) gas may be supplied to the process chamber 600 through the side gas distributors 623 at a flow rate of approximately 70 sccm to approximately 80 sccm. The oxygen ($O_2$) gas may be supplied to the process chamber 600 through the side gas distributors 623 at a flow rate of approximately 77 sccm. The silane ($SiH_4$) gas may be supplied to the process chamber 600 through the side gas distributors 623 at a flow rate of approximately 40 sccm to approximately 55 sccm. For example, the silane ($SiH_4$) gas may be supplied to the process chamber 600 through the side gas distributors 623 at a flow rate of approximately 43 sccm. Furthermore, the silane ($SiH_4$) gas may be supplied to the process chamber 600 through the upper gas distributor 621 at a flow rate of approximately 5 sccm to approximately 15 sccm. For example, the silane ($SiH_4$) gas may be supplied to the process chamber 600 through the upper gas distributor 621 at a flow rate of approximately 10 sccm. The helium (He) gas may be supplied as a carrier gas to the process chamber 600 through the side gas distributors 623 at a flow rate of approximately 250 sccm to approximately 350 sccm. For example, the helium (He) gas may be supplied to the process chamber 600 through the side gas distributors 623 at a flow rate of approximately 300 sccm. In addition to the deposition source including the oxygen ($O_2$), silane ($SiH_4$), and helium (He) gases, hydrogen ($H_2$) gas may be supplied to the process chamber 600 at a flow rate of approximately 100 sccm to approximately 150 sccm. For example, the hydrogen ($H_2$) gas may be supplied to the process chamber 600 at a flow rate of approximately 120 sccm.

Since the hydrogen ($H_2$) gas is additionally supplied to the process chamber 600, decomposition and deposition of silane ($SiH_4$) can gradual owing to an increased partial pressure of the hydrogen ($H_2$) gas. In this case, the first deposition layer 423 can grow at lateral surfaces of the second trenches 112 relatively faster than at bottom surfaces of the second trenches 112. Therefore, overhangs of the first deposition layer 423 at entrances of the second trenches 112 can be effectively prevented.

After the deposition is supplied to the process chamber 600, top power is illustratively applied to the top plasma coil 611 from the first power supply 612 in the range from approximately 6500 W to approximately 7500 W. For example, approximately 7000 W top power may be applied to the top plasma coil 611 from the first power supply 612. In addition, side power may be applied to the side plasma coil 613 from the second power supply 614 in the range from approximately 6500 W to approximately 7500 W. For example, approximately 7000 W side power may be applied to the side plasma coil 613 from the second power supply 614. The deposition source may be excited to a plasma state by the applied top and side power. In addition, bottom power is applied to the semiconductor substrate 100 from the third power supply 615 in the range from approximately 1900 W to approximately 2100 W so as to straighten the plasma source (the excited deposition source). For example, approximately 2000 W bottom power may be applied to the semiconductor substrate 100 from the third power supply 615. Owing to the plasma source, the first deposition layer 423 can be deposited on the buffer layer 421.

Figure 10:
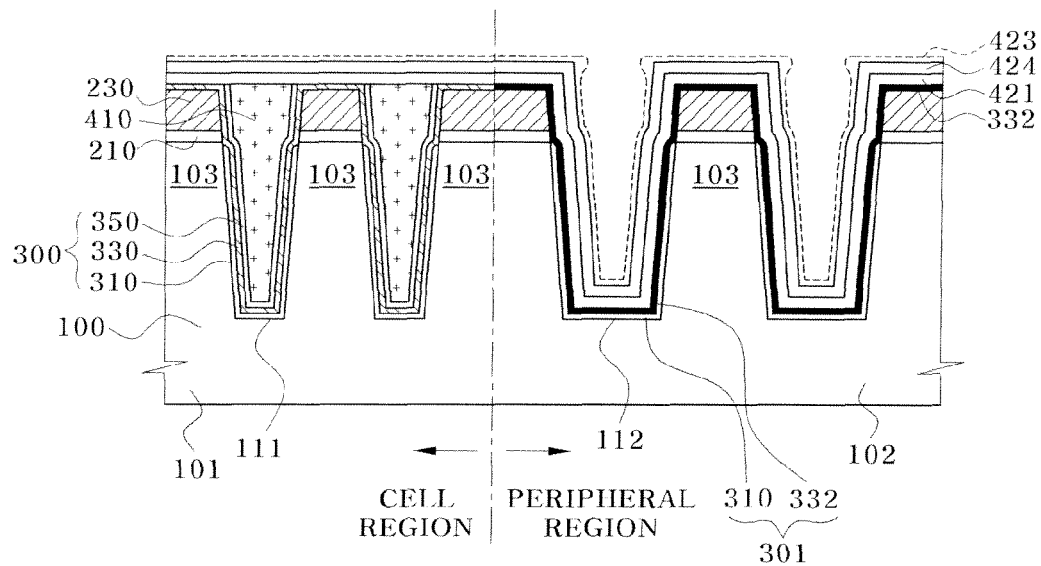

Referring to FIGS. 10 and 14, a first dry etch process is performed in situ with the deposition of the first deposition layer 423. The first dry etch process is performed to remove some thickness of the first deposition layer 423. In this case, overhangs of the first deposition layer 423 can be effectively reduced and removed since etching actions can be concentrated on the overhangs of the first deposition layer 423. The first dry etch process is preferably performed by supplying an etch source including nitrogen trifluoride ($NF_3$), hydrogen ($H_2$), and helium (He) gases to the process chamber 600, and exciting the etch source to a plasma state.

The nitrogen trifluoride ($NF_3$) gas is illustratively supplied to the process chamber 600 at a flow rate of approximately 100 sccm to approximately 200 sccm. For example, the nitrogen trifluoride ($NF_3$) gas may be supplied to the process chamber 600 at a flow rate of approximately 150 sccm. The hydrogen ($H_2$) gas may be supplied to the process chamber 600 at a flow rate of approximately 100 sccm to approximately 200 sccm. For example, the hydrogen ($H_2$) gas may be supplied to the process chamber 600 at a flow rate of approximately 150 sccm. The helium (He) gas may be supplied to the process chamber 600 through the side gas distributors 623 at a flow rate of approximately 55 sccm to approximately 65 sccm. For example, the helium (He) gas may be supplied to the process chamber 600 through the side gas distributors 623 at a flow rate of approximately 60 sccm.

Source power is illustratively applied as follows. Top power may be supplied to the top plasma coil 611 from the first power supply 612 in the range from approximately 1500 W to 2500 W. For example, approximately 2000 W top power may be supplied to the top plasma coil 611 from the first power supply 612. Side power may be supplied to the side plasma coil 613 from the second power supply 614 in the range from approximately 5500 W to approximately 6500 W. For example, approximately 6000-W side power may be supplied to the side plasma coil 613 from the second power supply 614. Bottom power may be supplied to the semiconductor substrate 100 from the third power supply 615 in the range from approximately 1000 W to approximately 1800 W. For example, approximately 1300-W bottom power may be supplied to the semiconductor substrate 100 from the third power supply 615.

During the first dry etch process, the first deposition layer 423 is preferably etched away by a thickness of approximately 85 Å to approximately 95 Å. For example, the first deposition layer 423 may be etched away by a thickness of approximately 80 Å. Therefore, owing to the first dry etch process, overhangs of the first deposition layer 423 can be reduced. After the first dry etch process, the first deposition layer 423 is denoted by reference numeral 424.

Figure 11:
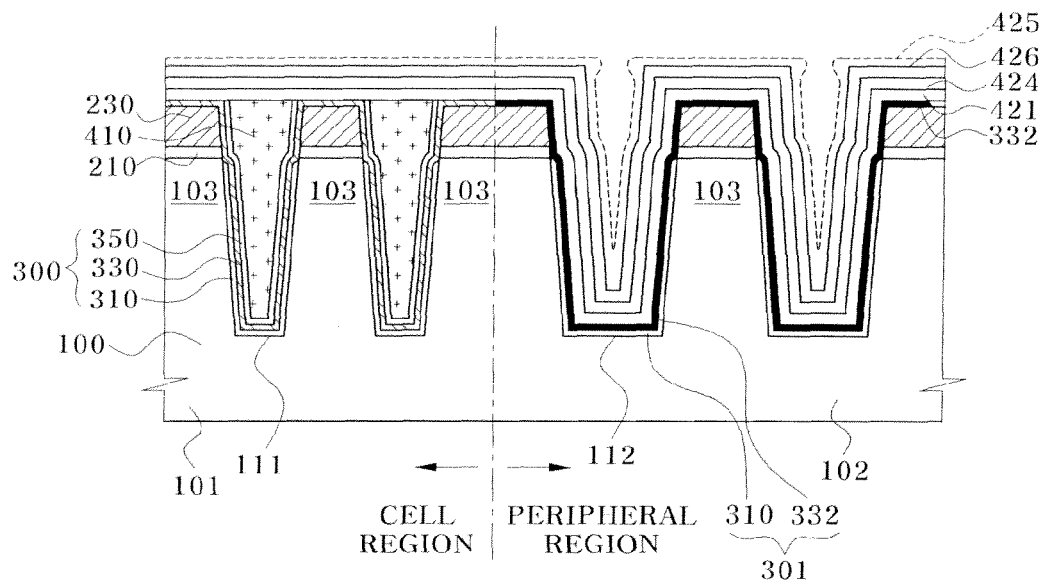

Referring to FIGS. 11 and 14, a second deposition layer 425 is deposited on the first deposition layer 424, preferably to a thickness greater than the original thickness of the first deposition layer 424 (i.e., the thickness of the first deposition layer 423). For example, the second deposition layer 425 is preferably deposited to a thickness of approximately 500 Å. The deposition of the second deposition layer 425 is preferably performed in situ with the first dry etch process. The second deposition layer 425 is preferably deposited in the same deposition conditions as the first deposition layer 423.

As in the case where the first deposition layer 423 is deposited, a deposition source including oxygen ($O_2$), silane ($SiH_4$), and helium (He) gases is preferably supplied to the process chamber 600 at the same or similar flow rates.

For example, the oxygen ($O_2$) gas may be supplied to the process chamber 600 through the side gas distributors 623 at a flow rate of approximately 70 sccm to approximately 80 sccm. For example, the oxygen ($O_2$) gas may be supplied to the process chamber 600 from the side gas distributors 623 at a flow rate of approximately 74 sccm. The silane ($SiH_4$) gas may be supplied to the process chamber 600 through the side gas distributors 623 at a flow rate of approximately 40 sccm to approximately 55 sccm. For example, the silane ($SiH_4$) gas may be supplied to the process chamber 600 through the side gas distributors 623 at a flow rate of approximately 43 sccm. Furthermore, the silane ($SiH_4$) gas may be supplied to the process chamber 600 through the upper gas distributor 621 at a flow rate of approximately 5 sccm to approximately 15 sccm. For example, the silane ($SiH_4$) gas may be supplied to the process chamber 600 through the upper gas distributor 621 at a flow rate of approximately 10 sccm. The helium (He) gas may be supplied as a carrier gas to the process chamber 600 through the side gas distributors 623 at a flow rate of approximately 250 sccm to approximately 350 sccm. For example, the helium (He) gas may be supplied to the process chamber 600 through the side gas distributors 623 at a flow rate of approximately 300 sccm. In addition to the deposition source including the oxygen ($O_2$), silane ($SiH_4$), and helium (He) gases, hydrogen ($H_2$) gas may be supplied to the process chamber 600 at a flow rate of approximately 100 sccm to approximately 150 sccm. For example, the hydrogen ($H_2$) gas may be supplied to the process chamber 600 at a flow rate of approximately 120 sccm.

Since the hydrogen ($H_2$) gas is additionally supplied to the process chamber 600, decomposition and deposition of silane ($SiH_4$) can gradual owing to an increased partial pressure of the hydrogen ($H_2$) gas. In this case, the second deposition layer 425 can grow at lateral surfaces of the second trenches 112 relatively faster than at bottom surfaces of the second trenches 112. Therefore, overhangs of the second deposition layer 425 at entrances of the second trenches 112 can be effectively prevented.

After the deposition is supplied to the process chamber 600, top power is preferably applied to the top plasma coil 611 from the first power supply 612 in the range from approximately 6500 W to approximately 7500 W. For example, approximately 7000 W top power may be applied to the top plasma coil 611 from the first power supply 612. In addition, side power may be applied to the side plasma coil 613 from the second power supply 614 in the range from approximately 6500 W to approximately 7500 W. For example, approximately 7000 W side power may be applied to the side plasma coil 613 from the second power supply 614. The deposition source may be excited to a plasma state by the applied top and side power. In addition, bottom power is applied to the semiconductor substrate 100 from the third power supply 615 in the range from approximately 1900 W to approximately 2100 W so as to straighten the plasma source (the excited deposition source). For example, approximately 2000 W bottom power may be applied to the semiconductor substrate 100 from the third power supply 615. Owing to the plasma source, the second deposition layer 425 can be deposited on the first deposition layer 424.

Thereafter, a second dry etch process is preferably performed in situ with the deposition of the second deposition layer 425. The second dry etch process is performed to remove some thickness of the second deposition layer 425. For example, the second deposition layer 425 is preferably etched away by a thickness of approximately 80 Å. In this case, overhangs of the second deposition layer 425 can be effectively reduced and removed since etching actions can be concentrated on the overhangs of the second deposition layer 425. The second dry etch process is preferably performed by supplying an etch source including nitrogen trifluoride ($NF_3$), hydrogen ($H_2$), and helium (He) gases to the process chamber 600, and exciting the etch source to a plasma state.

As in the first dry etch process, the nitrogen trifluoride ($NF_3$) gas is preferably supplied to the process chamber 600 at a flow rate of approximately 100 sccm to approximately 200 sccm. For example, the nitrogen trifluoride ($NF_3$) gas may be supplied to the process chamber 600 at a flow rate of approximately 150 sccm. The hydrogen ($H_2$) gas may be supplied to the process chamber 600 at a flow rate of approximately 100 sccm to approximately 200 sccm. For example, the hydrogen ($H_2$) gas may be supplied to the process chamber 600 at a flow rate of approximately 150 sccm. The helium (He) gas may be supplied to the process chamber 600 through the side gas distributors 623 at a flow rate of approximately 55 sccm to approximately 65 sccm. For example, the Helium (He) gas may be supplied to the process chamber 600 through the side gas distributors 623 at a flow rate of approximately 60 sccm. The helium (He) gas may be additionally supplied to the process chamber 600 through the upper gas distributor 621 at a flow rate of approximately 55 sccm to approximately 65 sccm. For example, the helium (He) gas may be additionally supplied to the process chamber 600 through the upper gas distributor 621 at a flow rate of approximately 60 sccm.

Source power is preferably applied to excite the deposition source as follows. Top power may be supplied to the top plasma coil 611 from the first power supply 612 in the range from approximately 1500 W to 2500 W. For example, approximately 2000 W top power may be supplied to the top plasma coil 611 from the first power supply 612. Side power may be supplied to the side plasma coil 613 from the second power supply 614 in the range from approximately 5500 W to approximately 6500 W. For example, approximately 6000 W side power may be supplied to the side plasma coil 613 from the second power supply 614. Bottom power may be supplied to the semiconductor substrate 100 from the third power supply 615 in the range from approximately 1000 W to approximately 1800 W. For example, approximately 1300 W bottom power may be supplied to the semiconductor substrate 100 from the third power supply 615.

Figure 12:
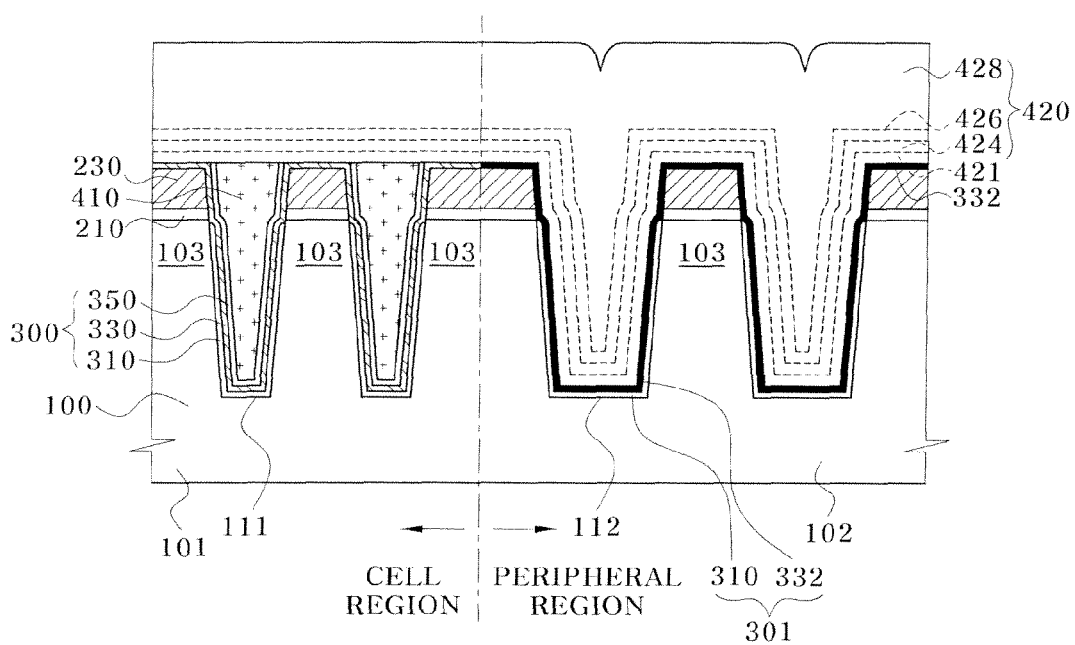

During the second dry etch process, the second deposition layer 425 is preferably etched away by a thickness of approximately 75 Å to approximately 95 Å. For example, the second deposition layer 425 may be etched away by a thickness of approximately 80 Å. Therefore, owing to the second dry etch process, overhangs of the second deposition layer 425 can be reduced. After the second dry etch process, the second deposition layer 425 is denoted by reference numeral 426. deposition and etch processes, which are similar to the deposition process for forming the second deposition layer 425 and the second dry etch process for removing some thickness of the second deposition layer 425, are repeated one or more times to form a third deposition layer 428 on the second deposition layer 426 as shown in FIG. 12. For example, such deposition and etch processes may be repeated at least five times to form the third deposition layer 428. Since the third deposition layer 428 is formed through a plurality of deposition/etch processes, gap-filling characteristics of the second trenches 112 can be improved, and less nano voids may be generated when the second trenches 112 are filled.

In this way, a second isolation layer 420 is formed to fill the second trenches 112. The second isolation layer 420 may include the buffer layer 421, the first deposition layer 424, the second deposition layer 426, and the third deposition layer 428. That is, the second isolation layer 420 includes oxide layers formed by repeating HDP deposition and etch processes. Heat treatment such as annealing can be performed on the second isolation layer 420 so as to reduce stresses of the second isolation layer 420 caused by the repetition of the HDP deposition and etch processes.

Figure 13:
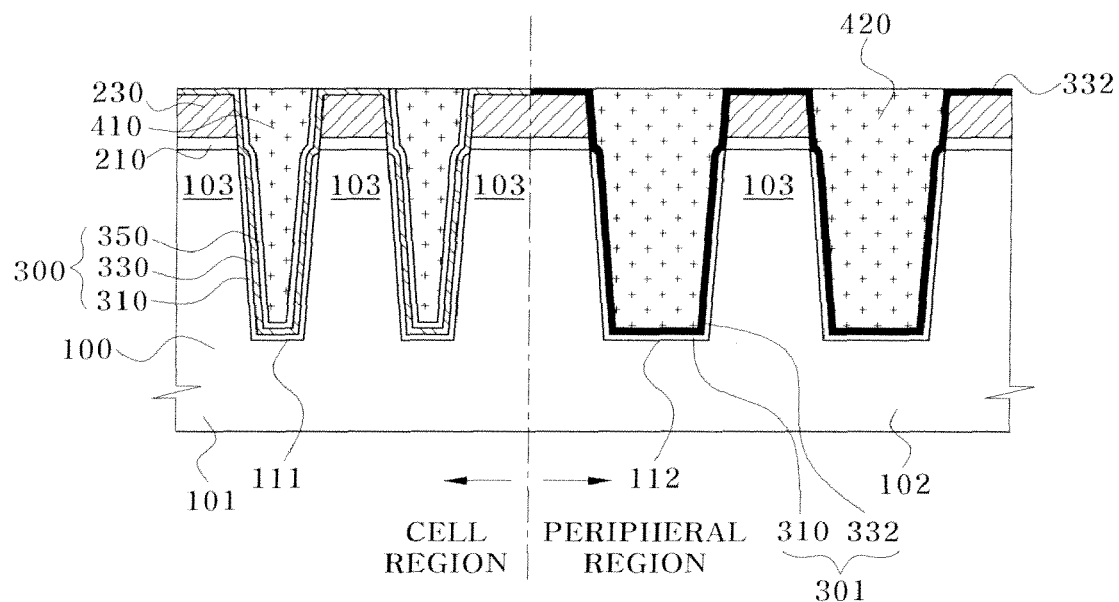

Thereafter, as shown in FIG. 13, the second isolation layer 420 is planarized. The planarization of the second isolation layer 420 is preferably performed by CMP until the nitride pad layer 230 or the silicon nitride layer 330 of the first liner layer 300 is exposed.

In the illustrated embodiment of the invention, since the line width of the first trenches 111 of the cell region 102 reduces as the design rule of a DRAM device reduces to 50 nm or less, the SOD having good gap filling characteristics is used to fill the first trenches 111. Thereafter, the silicon nitride layer 330 of the first liner layer 300 formed in the second trenches 112 of the peripheral region 102 is removed during an HDP process since the silicon nitride layer 330 causes electrical problems such as HEIR in a PMOS transistor. Then, deposition and etch processes are repeated at short intervals to fill the second trenches 112. In this case, the gap filling characteristics of the second trenches 112 can be improved, and generation of pores or voids can be prevented. Therefore, a semiconductor device having different isolation structures in cell and peripheral regions can be provided. That is, a semiconductor device having an improved isolation structure can be provided, and deterioration of PMOS transistors prevented.

Furthermore, in the illustrated embodiment of the invention, the second trenches 112 are filled with an HDP oxide layer instead of an SOD layer, and thus stresses caused by the SOD layer can be prevented. Therefore, silicon dislocation and slipping can be prevented at active regions close to the second trenches 112. during the annealing process performed in a curing process of the SOD layer at a temperature of approximately 350° C. to approximately 850° C., the SOD layer may shrinks, and thus compression strains may be applied to the second trenches 112. Since the second trenches 112 are wider than the first trenches 111, such strains can be concentrated on the second trenches 112.

In this case, silicon crystal structures of active regions adjacent to the second trenches 112 can be dislocated and slipped. Due to the dislocation and slipping, the active regions may not properly operate as channels of transistors. However, in the invention, since the SOD layer is not used for the second trenches 112, those problems can be prevented. On the other hand, the liner layer formed on the first trenches 111 includes the silicon nitride layer. Therefore, it can be adjusted such that tensile stresses of the silicon nitride layer compensate for compression strains caused by the SOD layer during the annealing process. Therefore, dislocation and slipping of silicon crystal structures can be prevented in the cell region.

Accordingly, the invention provides an isolation structure formed in a memory device using a flowable dielectric layer by an STI method, and a method for fabricating the isolation structure. The isolation structure is configured to prevent deterioration of HEIR characteristics of a PMOS transistor.

While the invention has been described with respect to the specific embodiments, various changes and modifications may be made without departing from the spirit and scope of the invention as defined in the following claims.

What is claimed is:

1. An isolation structure in a memory device, comprising:
a semiconductor substrate comprising a first trench in a cell region and a second trench in a peripheral region, the first trench defining a first active region of the semiconductor substrate in which a channel of an n-channel metal oxide semiconductor (NMOS) transistor is to be formed, the second trench being wider than the first trench and defining a second active region of the semiconductor substrate in which a channel of a p-channel metal oxide semiconductor (PMOS) transistor is to be formed;
a first liner layer disposed on the first trench and comprising a wall oxide layer portion formed by oxidizing a surface of the first trench and a silicon nitride layer portion disposed on the wall oxide layer portion and a first silicon oxide layer disposed on the silicon nitride layer;
a flowable dielectric layer comprising a polysilazane spin on dielectric (SOD) layer, disposed directly on the first silicon oxide layer of the first liner layer to fill the first trench;
a second liner layer disposed on the second trench and comprising the wall oxide layer portion formed by oxidizing a surface of the second trench and a second oxide layer formed by oxidizing the silicon nitride layer portion disposed on the wall oxide layer portion by using oxygen plasma; and
a high density plasma (HDP) oxide layer disposed directly on the second oxide layer of the second liner layer to fill the second trench.

* * * * *